United States Patent
Doyle et al.

(10) Patent No.: US 7,494,862 B2
(45) Date of Patent: Feb. 24, 2009

(54) METHODS FOR UNIFORM DOPING OF NON-PLANAR TRANSISTOR STRUCTURES

(75) Inventors: Brian Doyle, Portland, OR (US); Robert Chau, Beaverton, OR (US); Suman Datta, Beaverton, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 11/529,963

(22) Filed: Sep. 29, 2006

(65) Prior Publication Data

US 2008/0085580 A1 Apr. 10, 2008

(51) Int. Cl.
*H01L 21/8238* (2006.01)
(52) U.S. Cl. .................. 438/231; 257/E29.267
(58) Field of Classification Search .............. 438/231
See application file for complete search history.

(56) References Cited

U.S. PATENT DOCUMENTS 5,710,450 A 1/1998 Chau et al.
6,974,983 B1 * 12/2005 Hill et al. ............... 257/292

* cited by examiner

*Primary Examiner*—Thao X Le
*Assistant Examiner*—Kimberly Trice
(74) *Attorney, Agent, or Firm*—Blakely, Sokoloff, Taylor & Zafman LLP

(57) ABSTRACT

Methods for uniformly tip doping a silicon body of a non-planar transistor and devices and systems formed by such methods. In one embodiment, a method can include vertical tip ion implantation of a silicon body with at least three surfaces on a substrate followed by conformal deposition of a dielectric material. The dielectric material can be selectively etched to expose a top surface of the silicon body followed by selective re-oxidation of the top surface for form a mask. The remaining dielectric material can be removed followed by angled ion implantation of at least two sidewalls of the silicon body. The mask can be removed resulting in a silicon body with uniform doping.

10 Claims, 5 Drawing Sheets

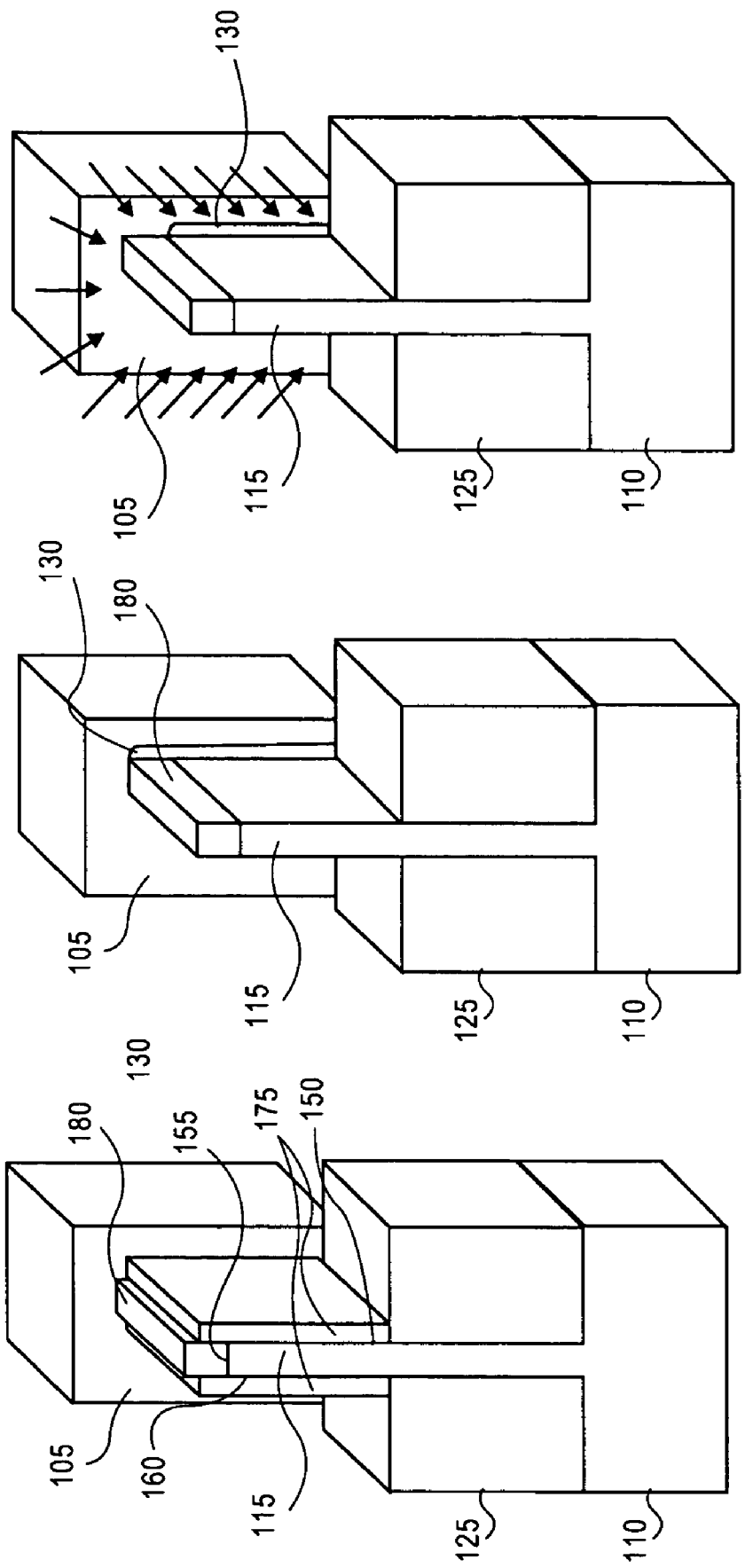

METHODS FOR UNIFORM DOPING OF NON-PLANAR TRANSISTOR STRUCTURES

FIELD OF INVENTION

Integrated circuit structures.

BACKGROUND OF INVENTION

A recent development in semiconductor processing is the tri-gate transistor, or non-planar transistor. A tri-gate transistor includes a thin semiconductor body (e.g., a silicon fin) formed on a substrate and having a top surface and two sidewall surfaces perpendicular to the top surface. A gate structure is formed on the substrate and the silicon fin perpendicular to the silicon fin. Source and drain regions are formed in the fin on opposite sides of the gate structure. Because the gate structure surrounds the silicon fin on the three surfaces, the transistor essentially has three separate gates. These three separate gates provide three separate channels for electrical signals to travel, thus effectively tripling the conductivity as compared to a conventional planar transistor.

Tri-gate transistors generally have superior performance to bulk gate devices. This is due to the proximity of the top and side gates relative to one another which causes full depletion and results in steeper sub-threshold gradients (SG) and smaller drain induced barrier lowering (DIBL). The SG and DIBL typically are used to determine short-channel effects (SCEs) in a transistor. In general, it is desired that SCEs are low such that the transistor off-state leakage current, $I_{OFF}$ (i.e., a current flowing between source and drain regions when a transistor is in an OFF state), remains as low as possible. A steeper SG and/or reduced DIBL indicates lower $I_{OFF}$, and thus smaller and better SCEs.

In the fabrication of tri-gate transistors, the silicon fin is subjected to ion implantation, or doping. In one method, the silicon fin is doped at a 45° angle. This results in the sidewalls being doped at approximately one-half the dose as the top surface of the silicon fin. In a variation of this method, the silicon fin is doped at both a 60° angle and a 30° angle. This results in the sidewalls and top surface being doped equally, but the sidewall is now doped at approximately two-thirds of the desired depth and one-third the desired depth on the top surface of the silicon fin. Additionally, when a substrate comprises a plurality of silicon fins on the same surface, one silicon fin can create a shadow on another silicon fin situated approximately perpendicular and approximately adjacent to one another in angled doping, which results in variable doping on the surfaces of the silicon fins. In yet another method, the substrate and silicon fin(s) are electrically grounded and subjected to plasma doping. This results in greater doping on the top surfaces of the silicon fin(s) relative to the sidewalls. The uneven doping of the silicon fin results in a change in resistance of the current.

BRIEF DESCRIPTION OF DRAWINGS

FIG. 3D illustrates an embodiment of selective deposition of an oxide mask on a top surface of silicon body depicted in FIGS. 3A-3C.

FIG. 3E illustrates an embodiment of removal of the remaining dielectric layer depicted in FIG. 3D.

FIG. 3F illustrates an embodiment of angled ion implantation of sidewalls of the silicon body depicted in FIGS. 3A-3E.

DETAILED DESCRIPTION

Figure 1:
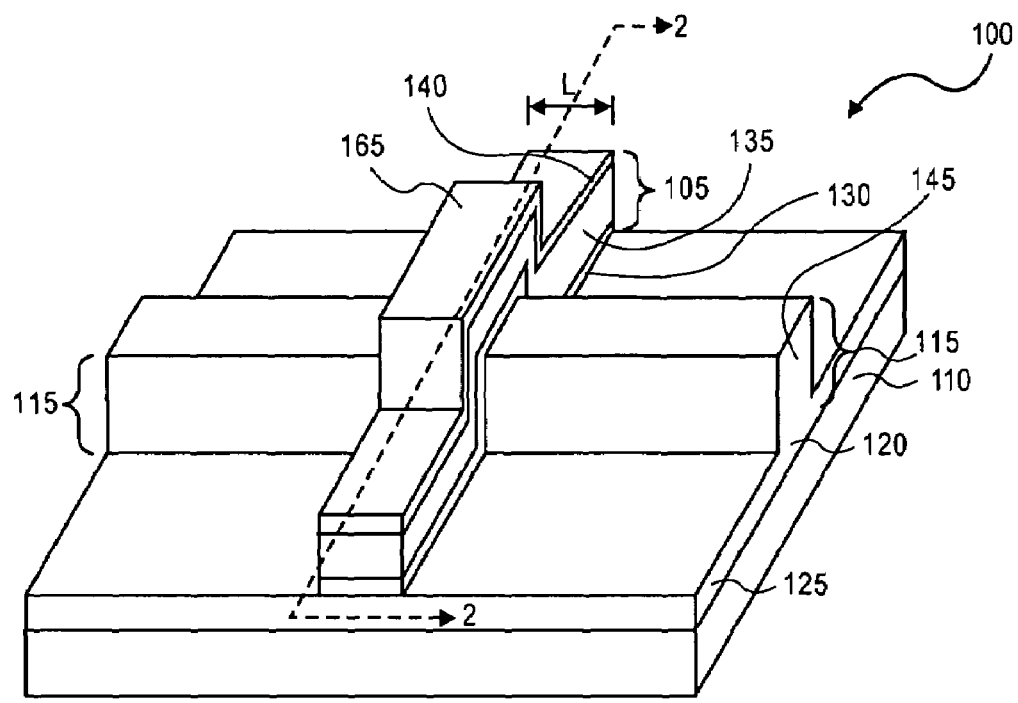
FIG. 1 illustrates a perspective top view of an embodiment of a tri-gate structure which forms a portion of a circuit substrate.

FIG. 1 illustrates a perspective view of an embodiment of a tri-gate structure which forms a portion of a circuit substrate. Structure 100 can include gate structure 105 formed on substrate 110 and on a portion of silicon body 115, i.e., silicon fin. "Silicon body" and "silicon fin" are hereinafter referred to interchangeably. Substrate 110 can be bulk silicon or silicon-on-insulator (SOI). Silicon fin 115 is in a different plane relative to substrate 110 and is situated perpendicular relative to gate structure 105. In some applications, structure 100 is referred to as a non-planar transistor.

In one embodiment, substrate 110 can be composed of a single crystal semiconductor material, which can be, for example, silicon or germanium. Silicon fin 115 can be composed of a semiconductor material such as silicon. Silicon fin 115 includes buried section 120, which lies below the surface of the plane of structure 100 and buried within oxide layer 125, and non-planar section 145. In the embodiment shown in FIG. 1, fin 115 including buried section 120 may be formed by patterning and etching substrate 110 to define fin 115 as a portion (a non-planar portion) of the substrate and depositing dielectric material, i.e., oxide layer 125, on a surface of substrate 110 (a top surface as viewed) adjacent to fin 115 to define buried section 120.

Gate structure 105 can include three layers 130, 135 and 140, respectively. Layer 130 can be a dielectric material, such as silicon dioxide ($SiO_2$), silicon nitride ($Si_3N_4$), oxynitride ($SiO_yN_x$) and the like. In some embodiments, layer 130 can be a high dielectric constant (high-k) dielectric material, such as hafnium oxide ($HfO_2$). Alternately, layer 130 can be a dielectric film with a metal at the top surface. Layer 135 can be a polycrystalline semiconductor material, such as polycrystalline silicon (polysilicon) or polysilicon germanium (poly-SiGe) or a metal material, such as titanium nitride. Layer 140, sometimes referred to as a "hard mask," can be a non-conductive material, such as silicon dioxide, silicon nitride and the like.

Figure 2:
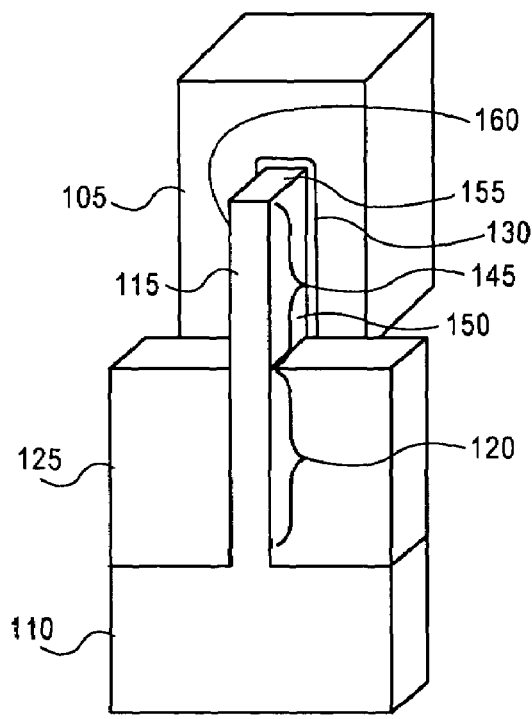
FIG. 2 shows a partial cross-section of the structure of FIG. 1 taken through line 2-2'.

FIG. 2 shows a partial cross-section of structure 100 taken through line 2-2' (without layer 140). As can be seen, non-planar section 145 of silicon fin 115 includes top surface 155 with first sidewall surface 150 and second sidewall surface 160 substantially perpendicular to top surface 155, respectively. Sidewall 150 and sidewall 160 are approximately equal but opposite relative to each other. Gate structure 105 surrounds a portion of surfaces 150, 155 and 160 on non-planar section 145 of silicon fin 115. The portion of surfaces 150, 155 and 160 approximately adjacent to gate structure 105 (backside not shown), and on either side of gate structure 105, can serve as source and drain regions to form a tri-gate structure.

Similar to a planar transistor, the source and drain regions of a tri-gate structure, i.e., the three surfaces 150, 155 and 160 of silicon fin 115, can be implanted with dopant ions to change a resistance of a semiconductor material. For PMOS transistor devices, the source and drain region are typically doped with p-type impurities, such as boron. For NMOS transistor devices, the source and drain region are typically doped with n-type impurities such as arsenic or phosphorous. Due to the non-planar nature of the source and drain regions in tri-gate structures, uniform doping presents a challenge.

Figure 3C:
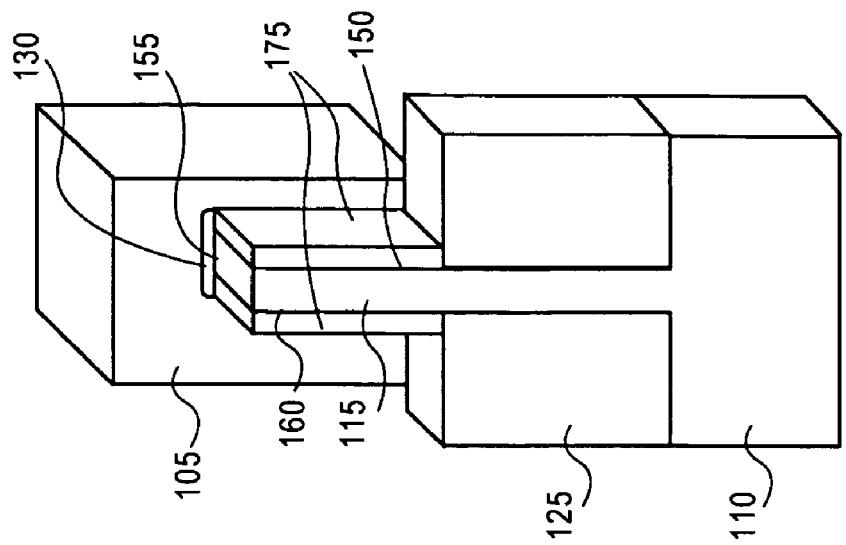
FIG. 3C illustrates an embodiment of selective removal of the dielectric layer depicted in FIG. 3B.
Figure 3B:
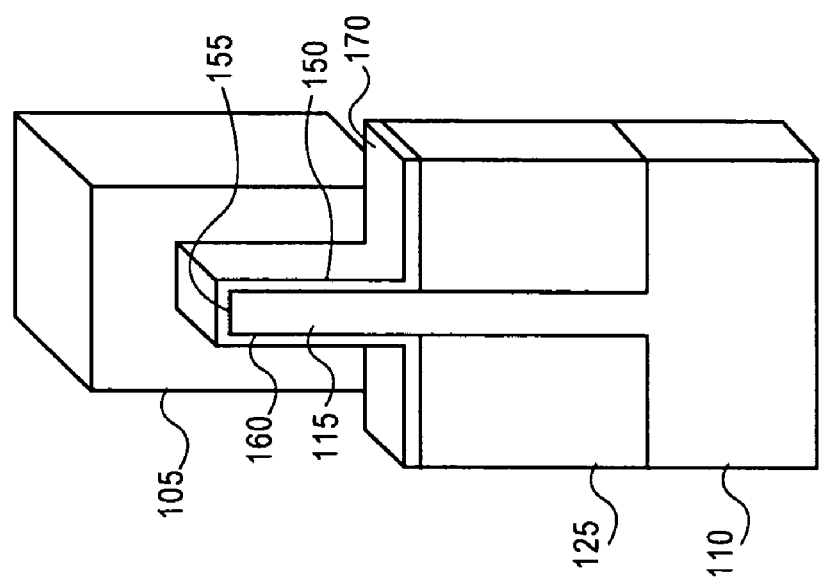
FIG. 3B illustrates an embodiment of conformal deposition of a selectively etchable and oxidation blocking dielectric layer of the structure depicted in FIG. 3A.
Figure 3A:
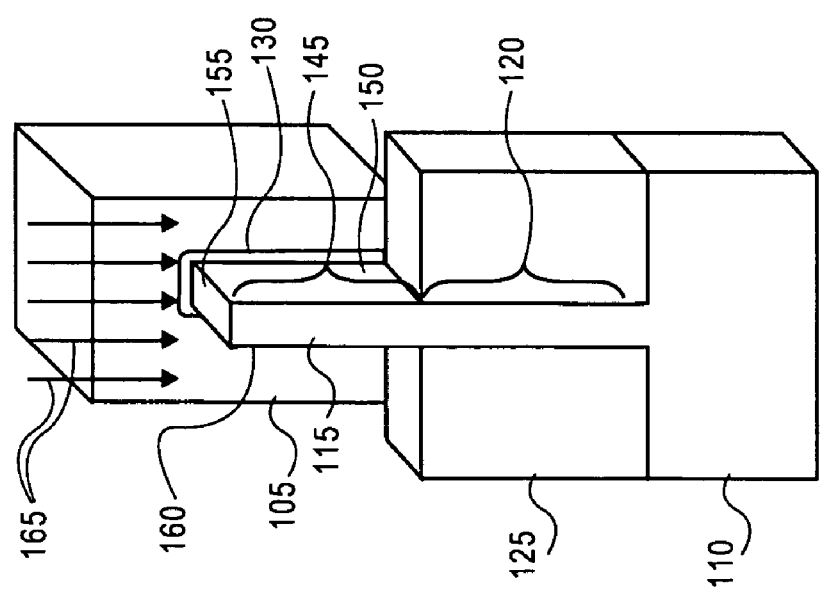
FIG. 3A illustrates an embodiment of vertical ion implantation of a top surface of a silicon body.

FIGS. 3A-3G illustrate an embodiment of uniformly tip doping a silicon fin. "Tip doping" refers to a shallow implant of dopants just below the surface of a substrate wherein the dopants reach the edge of the source/drain regions. In FIG. 3A, top surface 155 of silicon fin 115 is doped using a process, such as, for example, ionized implantation at 0°, i.e., vertical implantation. "Ionized implantation" is a physical process in which dopant atoms are ionized and isolated, accelerated, formed into a beam and targeted onto a substrate. The ions penetrate the surface and rest below the surface at a depth d, wherein the depth is controlled by certain parameters. Vertical ionized implantation (arrows 165) can be done immediately following etching of layer 135 of gate structure 105. At 0°, only top surface 155 is doped with ions. The depth d of the dopants in top surface 155 can be from about 20 angstroms (Å) to about 200 Å.

In FIG. 3B, a conformal layer 170 is deposited on silicon fin 115. In some embodiments, layer 170 has the characteristics of selective etchability and oxidation blocking. Examples of materials which can be used for layer 170 include, but are not limited to, silicon nitride ($Si_3N_4$), oxynitride ($SiO_yN_4$) and silicon carbide (SiC). Layer 170 can be in a thickness range from about 20 Å to about 100 Å. Layer 170 can be applied by processes known in the art. Examples of such processes include, but are not limited to, physical vapor deposition (PVD), atomic layer deposition (ALD), chemical vapor deposition (CVD), low pressure CVD, plasma-enhanced CVD or any other suitable process.

In FIG. 3C, layer 170 is anisotropically etched leaving spacers 175 on sidewalls 150 and 160 of silicon fin 115. "Anisotropic etching" is an etch process that exhibits little or no undercutting, resulting in features whose sides are perpendicular to the underlying layer. Reactive ion etch (RIE) is an example of a process that can be used for anisotropic etching.

FIG. 3D illustrates selective modification of top surface 155 of silicon fin 115. In some embodiments, the modification can be re-oxidation. Re-oxidation can be performed by a process such as thermal oxidation, plasma oxidation or implantation of an oxygen species followed by annealing. "Thermal oxidation" is a process in which oxygen ($O_2$) gas is applied to silicon at high temperature. The oxygen reacts with silicon to form silicon dioxide ($SiO_2$). Oxidation temperatures are between 600° C. and 1200° C. Re-oxidation results in a silicon dioxide layer 180, or "mask" on top surface 155 of silicon fin 115. Mask 180 can be in a thickness range from about 20 Å to about 200 Å. Re-oxidation is selective for top surface 155 since sidewalls 150 and 160. are protected by spacers 175. In addition, re-oxidation does not affect the gate structure 105 because it is protected by a spacer formation formed on the gate sidewall (not shown). In addition, re-oxidation may cause top surface 155 to be slightly recessed with respect to the channel.

In FIG. 3E, spacers 175 are removed by isotropic etching. "Isotropic etching" is a process in which etching occurs in all directions causing undercutting. An example of a chemical which can be used to remove spacers 175 is phosphoric acid.

Following removal of spacers 175 and layer 170, angled ion implantation can be performed to selectively dope sidewalls 150 and 155, illustrated in FIG. 3F. Angled ion implantation (arrows 185) can be conducted at an angle greater than 0°. Alternatively, plasma-induced ion implantation (PLAD) can be performed to selectively dope sidewalls 150 and 155. In PLAD, a substrate is placed in a plasma field in the presence of dopant atoms. With proper charges on the dopant atoms and the substrate, the dopant atoms accelerate to the substrate surface and penetrate exposed surfaces of the substrate. The depth d of the dopants in sidewalls 150 and 155 can be from about 10 Å to about 100 Å. Following doping, oxide mask 180 can be removed isotropically with, for example, hydrofluoric acid.

Figure 4:
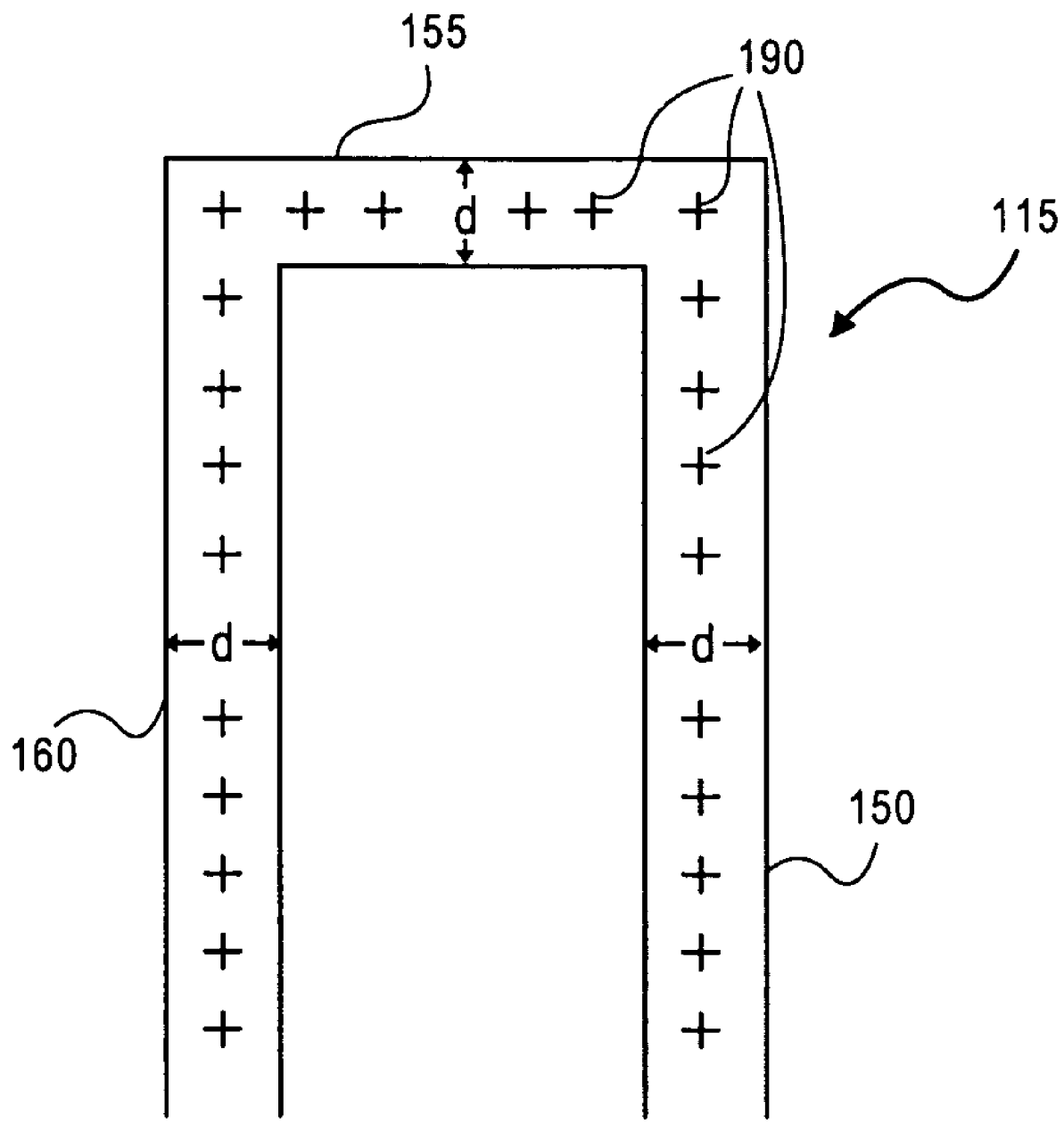
FIG. 4 illustrates an embodiment of an enlarged silicon body as depicted in FIGS. 3A-3F.

According to embodiments of the present invention, silicon fin 115 can be uniformly doped on surfaces 150, 155 and 160, respectively. FIG. 4 illustrates an enlargement of silicon fin 115 as depicted in FIGS. 3A-3F. As can be seen, silicon fin 115 is uniformly doped by ions 190 to a depth d below surfaces 150, 155 and 160. That is, the silicon fin is doped below each surface, to a depth such that the depth is approximately equal relative to adjacent surfaces. As a result, once fabrication is completed to create a functional transistor, the current flowing, or "wrapping around," silicon fin 115 should be uniform which results in a more efficient transistor. It should be understood that doping occurs simultaneously on the fin in both the source and drain regions on either side of gate structure 105 (backside not shown in FIGS. 3A-3F). Following uniform doping of silicon fin 115, structure 100 may undergo typical complementary field-effect transistor (CMOS) fabrication, which is well known by those skilled in the art.

Figure 5:
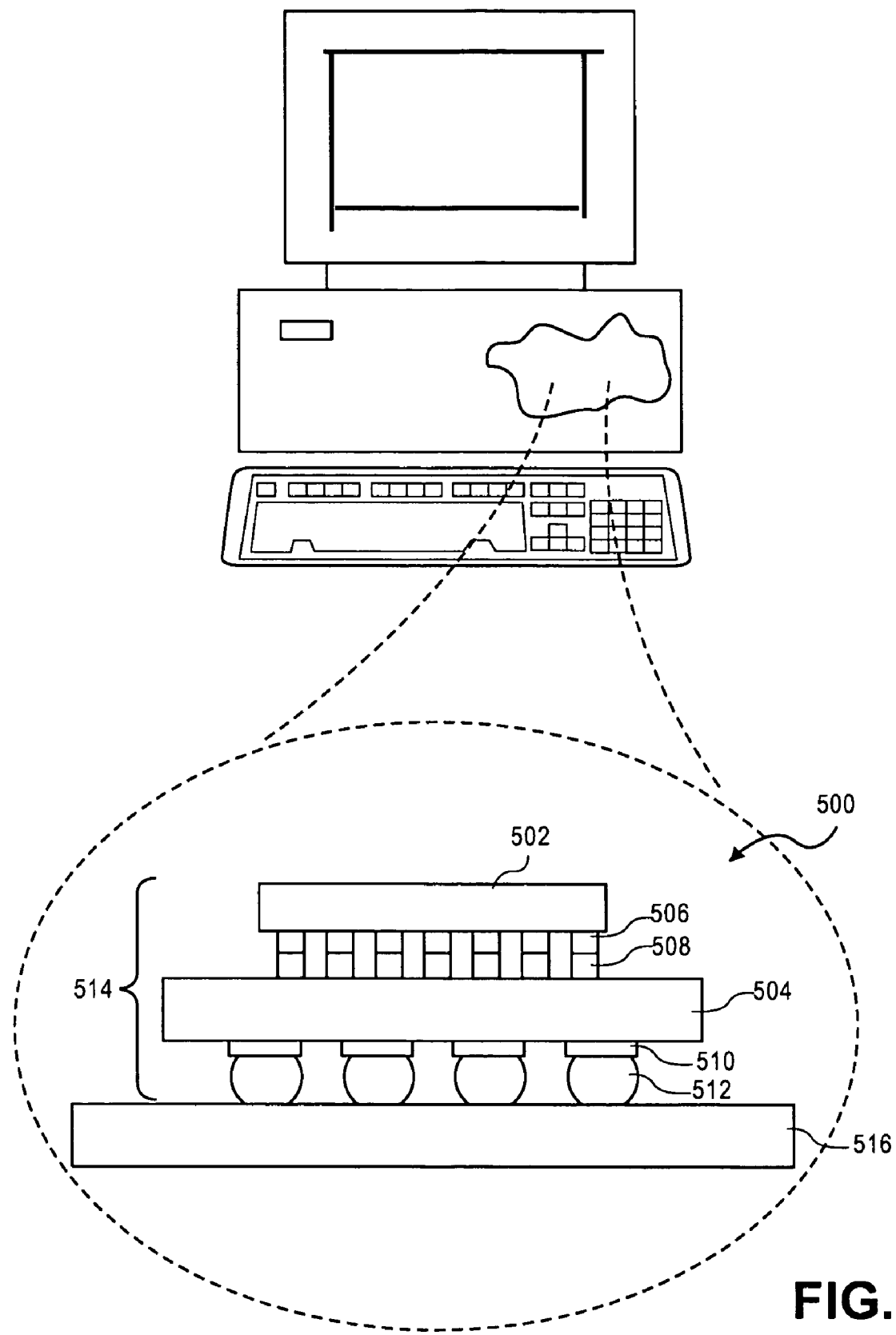
FIG. 5 shows a computer system including microprocessor enclosed by a package mounted to a printed circuit board.

FIG. 5 shows a cross-sectional side view of an integrated circuit package that is physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tapes and compact disc player, video cassette recorder, motion picture expert group audio layer 3 player (MP3), etc.), and the like. FIG. 5 illustrates the electronic assembly as part of a desktop computer. FIG. 5 shows electronic assembly 500 including die 502, physically and electrically connected to package substrate 504. Die 502 is an integrated circuit die, such as a microprocessor die, having, for example, transistor structures interconnected or connected to power/ground or input/output signals external to the die through interconnect lines to contacts 506 on an external surface of die 502. The die may be formed in accordance with known wafer processing techniques using as the substrate described with reference to FIGS. 3A-3F. Contacts 506 of die 502 may be aligned with contacts 508 making up, for example, a die bump layer on an external surface of package substrate 504. On a surface of package substrate 504 opposite a surface including contacts 508 are land contacts 510. Connected to each of land contacts 510 are solder bumps 512 that may be used to connect package 514 to circuit board 516, such as a motherboard or other circuit board.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:

forming a gate structure on a non-planar substrate including a silicon body with at least three exposed surfaces comprising a top surface, a first side surface approximately perpendicular to a first edge of the top surface and a second side surface approximately perpendicular to a second edge of the top surface;

selectively doping the top surface of the silicon body;

forming a conformal layer of a dielectric material over the silicon body;

selectively etching the conformal layer to expose the top surface of the silicon body;

selectively forming an oxide layer on the top surface of the silicon body;

removing any remaining conformal layer on the silicon body; and doping the first side surface and the second side surface of the silicon body.

2. The method of claim 1, further comprising removing the oxide layer from the silicon body.

3. The method of claim 2, wherein the oxide layer is removed isotropically.

4. The method of claim 1, wherein the selectively doping comprises ionized implantation at 0°.

5. The method of claim 1, wherein the dielectric material has the characteristics of selective etchability and oxidation blocking.

6. The method of claim 5, wherein the dielectric material is nitride ($Si_3N_4$) or silicon carbide (SiC).

7. The method of claim 1, wherein the selectively etching is anisotropic.

8. The method of claim 1, wherein the oxide layer is formed from one of thermal oxidation, plasma oxidation or implanting of oxygen species followed by annealing.

9. The method of claim 1, wherein the removing is isotropic.

10. The method of claim 1, wherein the doping of the first side surface and the second side surface is one of angled implantation or plasma-induced ion implantation.

* * * * *